(12) United States Patent
Kirihara

(10) Patent No.: US 10,692,740 B2
(45) Date of Patent: Jun. 23, 2020

(54) LASER PROCESSING APPARATUS

(71) Applicant: DISCO CORPORATION, Tokyo (JP)

(72) Inventor: Naotoshi Kirihara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 281 days.

(21) Appl. No.: 15/586,921

(22) Filed: May 4, 2017

(65) Prior Publication Data

US 2017/0330774 A1    Nov. 16, 2017

(30) Foreign Application Priority Data

May 12, 2016   (JP) .................................. 2016-095880

(51) Int. Cl.
| | | |
|---|---|---|
| H01L 21/67 | (2006.01) | |
| B23K 26/0622 | (2014.01) | |
| B23K 26/351 | (2014.01) | |
| B23K 26/382 | (2014.01) | |
| H01L 21/687 | (2006.01) | |
| H01L 21/78 | (2006.01) | |
| B23K 26/359 | (2014.01) | |
| B23K 101/40 | (2006.01) | |

(52) U.S. Cl.
CPC .... *H01L 21/67092* (2013.01); *B23K 26/0622* (2015.10); *B23K 26/351* (2015.10); *B23K 26/359* (2015.10); *B23K 26/382* (2015.10); *H01L 21/68714* (2013.01); *H01L 21/78* (2013.01); *B23K 2101/40* (2018.08)

(58) Field of Classification Search
CPC ......... H01L 21/67092; H01L 21/68714; H01L 21/78; B23K 26/359; B23K 26/382; B23K 26/0622

See application file for complete search history.

(56) References Cited

U.S. PATENT DOCUMENTS

| 6,574,250 B2 * | 6/2003 | Sun ........................ B23K 26/04 219/121.67 |
|---|---|---|
| 7,804,043 B2 * | 9/2010 | Deshi ..................... B23K 26/40 219/121.67 |
| 2010/0246611 A1 * | 9/2010 | Sun .................... B23K 26/0622 372/18 |
| 2015/0165562 A1 * | 6/2015 | Marjanovic ......... C03B 33/0222 428/64.1 |
| 2018/0161916 A1 * | 6/2018 | Hosseini ............ B23K 26/0648 |

FOREIGN PATENT DOCUMENTS

| JP | 10-305420 | 11/1998 |
|---|---|---|
| JP | 2002-192370 | 7/2002 |
| JP | 2014-221483 | 11/2014 |

\* cited by examiner

*Primary Examiner* — Philip C Tucker
*Assistant Examiner* — Jimmy R Smith, Jr.
(74) *Attorney, Agent, or Firm* — Greer Burns & Crain, Ltd.

(57) ABSTRACT

A laser oscillator of a laser processing apparatus generates burst pulses each composed of a plurality of sub-pulses. The plurality of sub-pulses are generated in such a manner that the energy of the sub-pulse sequentially changes from a lower energy to a higher energy, and the burst pulses are applied to a wafer, whereby the wafer is formed therein with shield tunnels extending from the front surface to the back surface of the wafer and each being composed of a minute hole and an amorphous phase surrounding the minute hole.

1 Claim, 4 Drawing Sheets

LASER PROCESSING APPARATUS

BACKGROUND OF THE INVENTION

Field of the Invention

The present invention relates to a laser processing apparatus for performing laser processing to form division starting points along division lines of a wafer.

Description of the Related Art

A wafer having a plurality of devices such as integrated circuits (ICs), large scale integrations (LSIs), light emitting diodes (LEDs), surface acoustic wave (SAW) devices, and power devices formed in regions on a front surface partitioned by division lines is divided into individual device chips by a laser processing apparatus, and the thus divided device chips are used for electric apparatuses such as mobile phones, personal computers, and lighting apparatuses (see, for example, Japanese Patent Laid-open No. 1998-305420).

The laser processing apparatus generally includes a chuck table for holding a workpiece, laser beam applying means including a focusing device for applying a laser beam to the workpiece held by the chuck table, and processing feeding means for performing relative processing feeding of the chuck table and the laser beam applying means. By the laser processing apparatus, the laser beam can be highly accurately applied along division lines of a wafer, to process the wafer for dividing the wafer.

The laser processing apparatuses are classified into those of the type in which a laser beam having such a wavelength as to be absorbed in the workpiece is applied to the workpiece to subject the workpiece's surface to ablation, as disclosed in Japanese Patent Laid-open No. 1998-305420, and those of the type in which a laser beam having such a wavelength as to be transmitted through the workpiece is applied with a focal point positioned inside the workpiece to form modified layers inside the workpiece, as described, for example, in Japanese Patent No. 3408805.

However, both of the above-mentioned two types of laser processing apparatuses have the problem of poor productivity, since the laser beam must be applied along the division lines a plurality of times, in order to cut the wafer while attaining good quality. In view of this problem, the present inventor has developed and already proposed a technology for forming shield tunnels extending from the front surface to the back surface of a wafer along the division lines, each of the shield tunnels being composed of a minute hole and an amorphous phase surrounding the minute hole (see, for example, Japanese Patent Laid-open No. 2014-221483).

SUMMARY OF THE INVENTION

According to the technology disclosed in Japanese Patent Laid-open No. 2014-221483, shield tunnels extending from the front surface to the back surface of a wafer along the division lines and each being composed of a minute hole and an amorphous phase surrounding the minute hole can be formed in the wafer, whereby brittle portions serving as division starting points can be formed. It has been found, however, that this technology has a problem in that when the laser beam is applied from the back surface of the wafer to form the shield tunnels, part of the laser beam applied from laser beam applying means would reach a layer (epitaxial layer) in which the devices are formed on the front surface of the wafer, whereby the devices formed on the front surface would be damaged, leading to a lowering in device quality.

Accordingly, it is an object of the present invention to provide a laser processing apparatus by which shield tunnels extending from the front surface to the back surface of a wafer along division lines and each being composed of a minute hole and an amorphous phase surrounding the minute hole can be formed by laser processing, without damaging the devices formed on the wafer.

In accordance with an aspect of the present invention, there is provided a laser processing apparatus including a chuck table that holds a wafer, laser beam applying means that applies a laser beam to the wafer held by the chuck table, and processing feeding means that performs relative processing feeding of the chuck table and the laser beam applying means. The laser beam applying means includes a laser oscillator that oscillates a pulsed laser beam, and a focusing device that focuses the pulsed laser beam oscillated by the laser oscillator to apply the pulsed laser beam to the wafer held by the chuck table. The pulsed laser beam oscillated by the laser oscillator includes burst pulses each having a plurality of sub-pulses, and the burst pulses are applied to the wafer to form shield tunnels each including a minute hole and an amorphous phase surrounding the minute hole.

Preferably, the laser oscillator generates the plurality of sub-pulses constituting the burst pulse in such a manner that energy of the sub-pulse sequentially changes from a lower energy to a higher energy. The pulsed laser beam including the burst pulses thus configured is applied to the wafer, whereby shield tunnels extending from the front surface to the back surface of the wafer and each including a minute hole and an amorphous phase surrounding the minute hole are effectively formed.

According to the laser processing apparatus of the present invention, the pulsed laser beam oscillated by the laser oscillator includes the burst pulses each having a plurality of sub-pulses, and the pulsed laser beam including the burst pulses is applied to the wafer, to form the shield tunnels each including the minute hole and the amorphous phase surrounding the minute hole. Therefore, the energy per one pulse applied to the wafer is dispersed into the plurality of sub-pulses, and almost the whole of the energy given by the laser beam is used for forming the shield tunnels, and generation of leakage light is restrained. Therefore, damaging of the devices formed on the wafer is obviated, and the problem of lowering in device quality can be solved.

In addition, at the time of applying the laser beam, the laser oscillator generates the sub-pulses constituting the burst pulse in such a manner that the energy of the sub-pulse sequentially changes from a lower energy to a higher energy. When the pulsed laser beam including the burst pulses each having sub-pulses changing from a lower energy to a higher energy is applied to the wafer, each shield tunnel is gradually formed. Therefore, almost the whole of the energy of the pulsed laser beam is effectively used for forming the shield tunnels, and, further, leakage light can be reduced. Accordingly, the problem of lowering in device quality can be solved more reliably.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
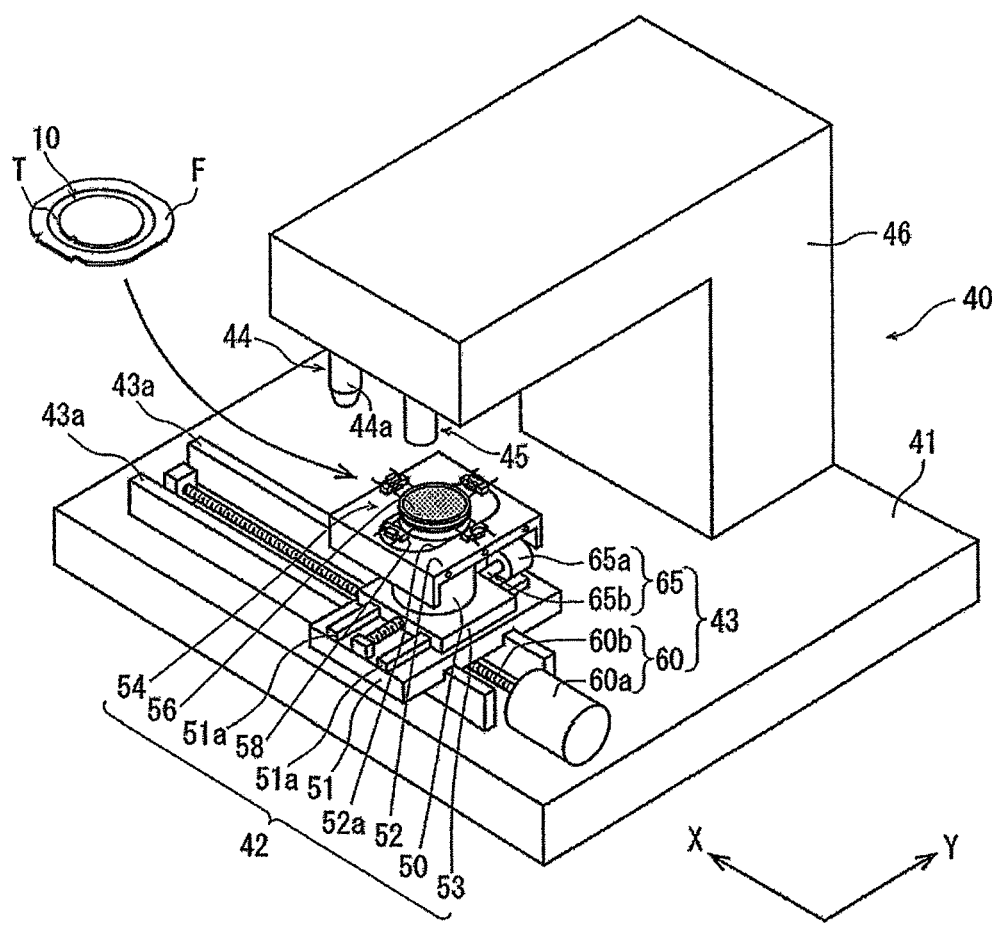
FIG. 1 is a perspective view of a laser processing apparatus including laser beam applying means according to an embodiment of the present invention.

A laser processing apparatus according to the present invention and an operation thereof will be described in detail below, referring to the attached drawings. FIG. 1 shows a general perspective view of a laser processing apparatus 40 for laser processing which is configured based on the present invention. The laser processing apparatus 40 shown in the figure includes a base 41, a holding mechanism 42 for holding a wafer 10, moving means 43 for moving the holding mechanism 42, laser beam applying means 44 for applying a laser beam to the wafer 10 held by the holding mechanism 42, imaging means 45, and a controller 20 (see FIG. 2) composed of a computer which will be described later, each of the means being controlled by the controller 20.

The holding mechanism 42 includes a rectangular X-direction movable plate 51 mounted on the base 41 in such a manner as to be movable in an X-direction, a rectangular Y-direction movable plate 53 mounted on the X-direction movable plate 51 in such a manner as to be movable in a Y-direction, a hollow cylindrical support column 50 fixed to an upper surface of the Y-direction movable plate 53, and a rectangular cover plate 52 fixed to an upper end of the support column 50. The cover plate 52 is formed with a slot 52a extending in the Y-direction. A chuck table 54 extending upward through the slot 52a is provided as holding means for holding a circular workpiece, and a circular suction chuck 56 formed from a gas-permeable porous material and extending substantially horizontally is disposed on an upper surface of the chuck table 54. The suction chuck 56 is connected to suction means (not shown) through a passage extending through the support column 50. At a periphery of the chuck table 54, a plurality of clamps 58 are arranged at intervals along the circumferential direction. Note that the X-direction is the direction indicated by arrow X in FIG. 1, and the Y-direction is the direction indicated by arrow Y in FIG. 1 and orthogonal to the X-direction. A plane defined by the X-direction and the Y-direction is substantially horizontal.

The moving means 43 includes X-direction moving means 60, Y-direction moving means 65, and rotating means (not shown). The X-direction moving means 60 includes a ball screw 60b extending in the X-direction over the base 41, and a motor 60a connected to one end portion of the ball screw 60b. A nut portion (not shown) of the ball screw 60b is fixed to a lower surface of the X-direction movable plate 51. The X-direction moving means 60 converts a rotational motion of the motor 60a into a rectilinear motion and transmits the rectilinear motion to the X-direction movable plate 51 by the ball screw 60b, thereby advancing or retracting the X-direction movable plate 51 in the X-direction along guide rails 43a on the base 41. The Y-direction moving means 65 includes a ball screw 65b extending in the Y-direction over the X-direction moving plate 51, and a motor 65a connected to one end portion of the ball screw 65b. A nut portion (not shown) of the ball screw 65b is fixed to a lower surface of the Y-direction movable plate 53. The Y-direction moving means 65 converts a rotational motion of the motor 65a into a rectilinear motion and transmits the rectilinear motion to the Y-direction movable plate 53 by the ball screw 65b, thereby advancing or retracting the Y-direction movable plate 53 in the Y-direction along guide rails 51a on the X-direction movable plate 51. The rotating means is incorporated in the support column 50, and rotates the suction chuck 56 relative to the support column 50.

As has been described above, the laser processing apparatus 40 in this embodiment has the controller 20, which is composed of a computer and includes a central processing unit (CPU) performing arithmetic processes according to a control program, a read only memory (ROM) for storing the control program, etc., a readable/writable random access memory (RAM) for temporarily storing detection values obtained by detection, results of arithmetic processes, etc., an input interface, and an output interface (details are omitted in the drawing). In addition to an image signal from the imaging means 45, signals from X-direction and Y-direction position detecting means (not shown) of the holding mechanism 42, etc. are inputted to the input interface of the controller. Besides, operation signals are transmitted from the output interface to the laser beam applying means 44 described later, the X-direction moving means 60, the Y-direction moving means 65 and the like.

Figure 2A:
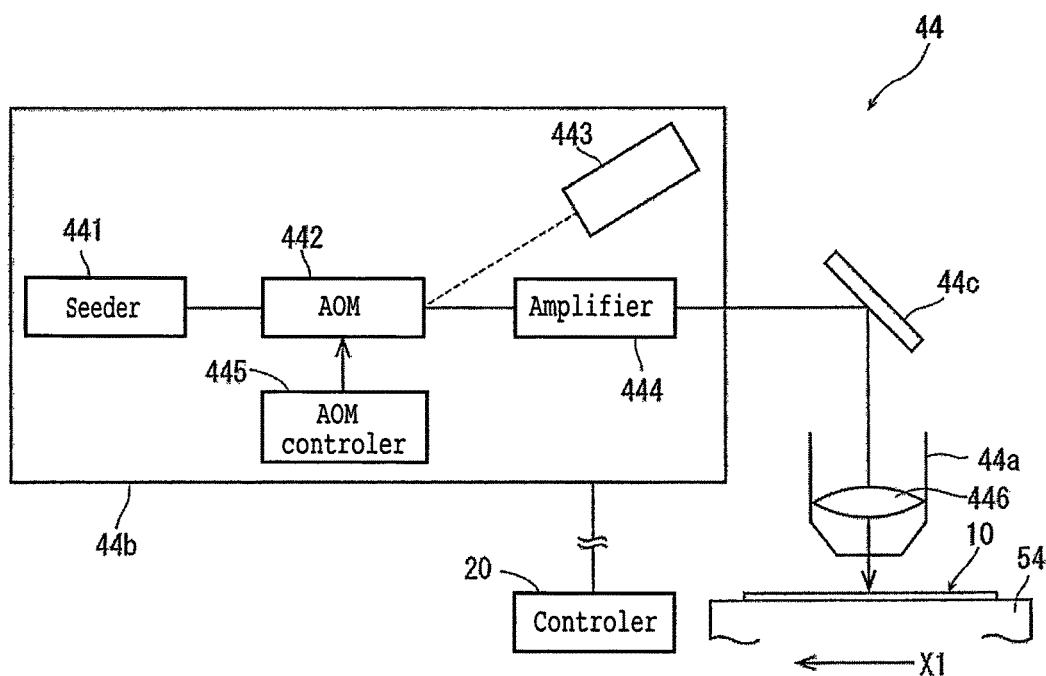
FIG. 2A is a block diagram outlining the laser beam applying means.

The laser beam applying means 44 is incorporated in a frame body 46 which extends upward from an upper surface of the base 41 and then extends substantially horizontally. The laser beam applying means 44 includes a configuration for forming shield tunnels along division lines of the wafer 10 serving as the workpiece, each of the shield tunnels including a minute hole and an amorphous phase surrounding the minute hole. More specifically, as shown in FIG. 2A, the laser beam applying means 44 in the present invention includes a laser oscillator 44b, a reflector 44c for reflecting a pulsed laser beam outputted from the laser oscillator 44b, and a focusing device 44a having a focusing lens 446 by which the pulsed laser beam changed in optical path by the reflector 44c is focused and applied to the wafer 10.

The laser oscillator 44b includes a seeder 441 for oscillating a low-output high-frequency pulsed laser beam as seed light, an acousto-optic modulator (hereinafter referred to as "AOM") 442 on which the high-frequency pulsed laser beam oscillated from the seeder 441 is incident, a beam dump 443 for absorbing the pulsed laser beam thinned out by a diffraction grating action of the AOM 442, and an amplifier 444 for amplifying the output of the high-frequency pulse transmitted through the AOM 442 in such a manner as to enable formation of shield tunnels. The AOM 442 thins out the incident pulsed laser beam by a predetermined number of pulses at a predetermined repetition frequency by its diffraction grating action, to output a pulsed laser beam composed of a pulse (hereinafter referred to as "burst pulse") having a plurality of high-frequency pulses (in this embodiment, five pulses, which will hereinafter be referred to as "sub-pulses") as one unit.

Figure 2B:
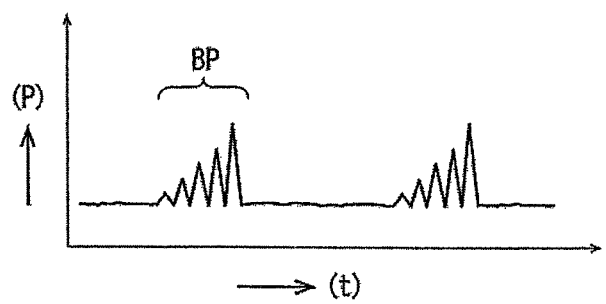
FIG. 2B is a graph showing time variation of a burst pulse composed of a plurality of sub-pulses.

The AOM 442 includes an acousto-optic medium formed from a tellurite-based glass, for example, and a piezoelectric element (not shown) is adhered to the acousto-optic medium. The acousto-optic medium is a medium which produces a diffraction grating action by a photoelastic effect when an ultrasonic vibration is transmitted thereto by the piezoelectric element, and an AOM controller 445 for generating an arbitrary ultrasonic vibration is connected to the piezoelectric element of the AOM 442. By controlling the AOM controller 445, it is possible to form an arbitrary number of sub-pulses that are transmitted through the AOM 442. Besides, in this embodiment, as shown in FIG. 2B, by the action of the amplifier 444 in addition to the action of the AOM 442, the output (P) of each of the five sub-pulses constituting one burst pulse (BP) is gradually amplified stepwise from a lower energy to a higher energy at the time of outputting, whereby a pulsed laser beam capable of forming shield tunnels is outputted, at a repetition frequency with the burst pulse as one pulse. The seeder 441, the AOM 442 and the amplifier 444 as above-described are appropriately controlled by the controller 20 provided in the laser processing apparatus 40.

Figure 3:
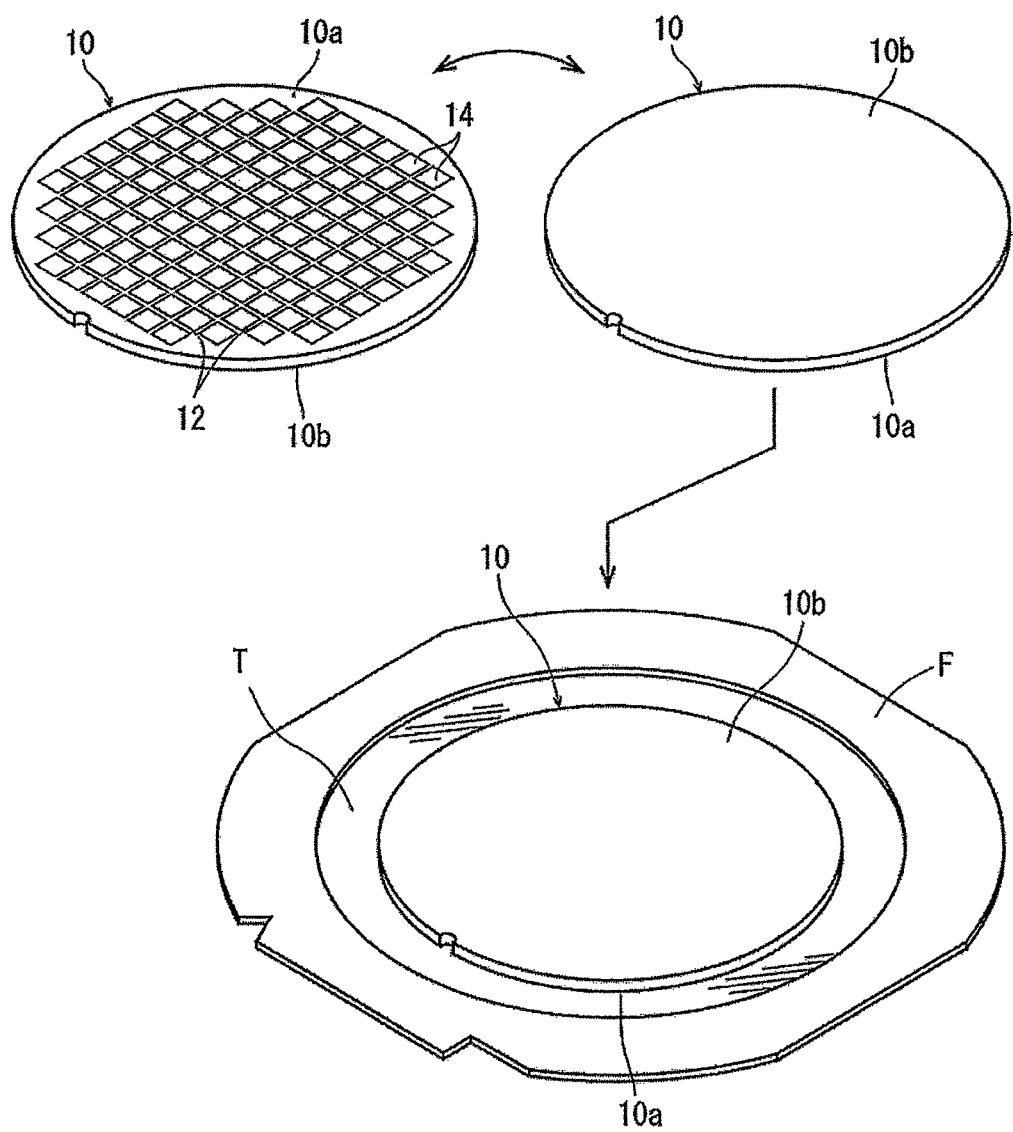
FIG. 3 is a perspective view illustrating a holding step of holding by a frame a wafer to be processed by the laser processing apparatus of FIG. 1.

An operation of the laser processing apparatus 40 configured based on the present invention will be described in order. First, as depicted in FIG. 3, a wafer 10 including, for example, lithium niobate (LiNbO$_3$) as a substrate is prepared. A plurality of regions are partitioned on a front surface 10a side of the wafer 10 by a plurality of crossing division lines 12, and SAW devices 14 are formed in the thus partitioned regions. In this embodiment, in order that a laser beam for forming division starting points inside the wafer 10 as the workpiece is applied from a back surface 10b side of the wafer 10, the wafer 10 is located at an opening portion of an annular frame F with the back surface 10b side of the wafer 10 on the upper side, the front surface 10a side of the wafer 10 is adhered to a adhesive tape T, and a peripheral portion of the adhesive tape T is attached to the annular frame F, whereby the wafer 10 is supported by the frame F through the adhesive tape T. The wafer 10 is placed on the suction chuck 56 of the chuck table 54 of the laser processing apparatus 40, with the adhesive tape T side on the lower side, namely, with the front surface 10a side on the lower side, the annular frame F is held by the clamps 58, and the suction means (not shown) is operated to cause a negative pressure to act on the suction chuck 56, whereby the wafer 10 is held by suction.

After the wafer 10 is held on the suction chuck 56 by suction, the X-direction moving means 60 and the Y-direction moving means 65 are operated to move the chuck table 54, whereby the wafer 10 is positioned just under the imaging means 45. When the chuck table 54 is positioned just under the imaging means 45, an alignment step for detecting that region of the wafer 10 which is to be laser processed is performed by the imaging means 45 and the controller 20. Specifically, the imaging means 45 and the controller 20 perform image processing such as pattern matching for position matching between the division line 12 formed in a predetermined direction on the wafer 10 and the focusing device 44a of the laser beam applying means 44 for applying the laser beam along the positions corresponding to the division line 12, thereby performing alignment of the laser beam applying position. A similar alignment step is carried out also along the division line 12 formed in a direction orthogonal to the predetermined direction.

After the alignment step as above is conducted, the chuck table 54 is moved into the laser beam applying region in which the focusing device 44a is positioned, and such a positioning that one end of a predetermined division line 12 formed in the first direction is positioned just under the focusing device 44a is performed. Then, focal point position adjusting means (not shown) is operated to move the focusing device 44a in the optical axis direction, whereby the focal point is positioned at a predetermined position inside the lithium tantalate substrate constituting the wafer 10.

Figure 4A:
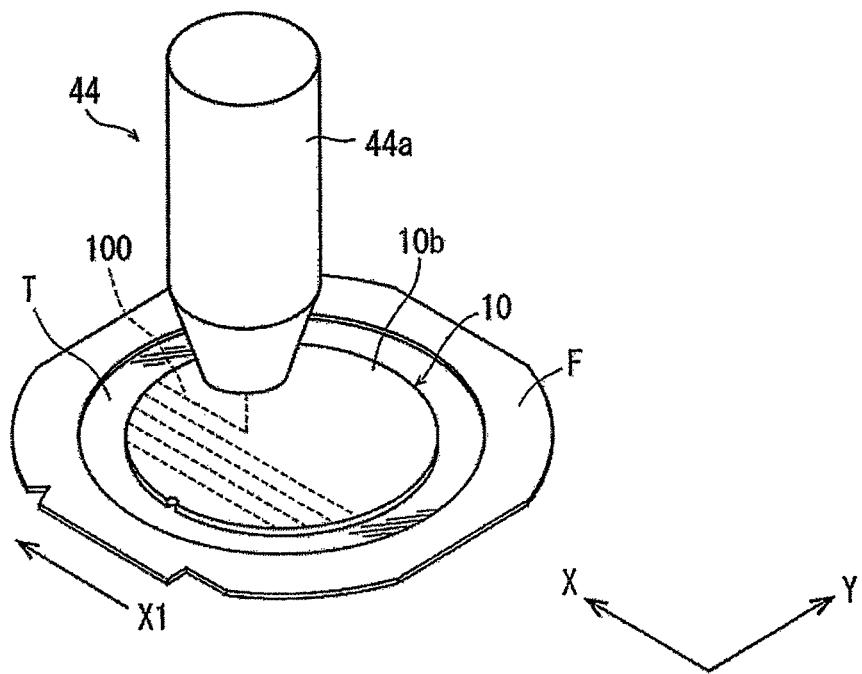
FIG. 4A is a perspective view illustrating a laser processing step.
Figure 4B:
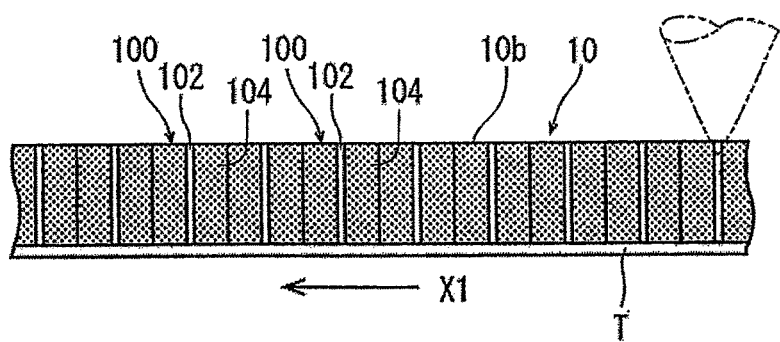
FIG. 4B is a sectional view of a wafer formed therein with a plurality of shield tunnels.
Figure 4C:
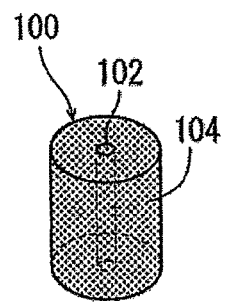
FIG. 4C is a schematic perspective view of one shield tunnel.

After the positioning of the focal point as above is conducted, the laser beam applying means 44 is operated to apply a pulsed laser beam for forming shield tunnels 100 inside the wafer 10 by the laser oscillator 44b, as shown in FIG. 4A. The pulsed laser beam is focused by the focusing device 44a, to be applied to one end portion of the division line 12 on the wafer 10. When the application of the laser beam has been started, the X-direction moving means 60 is operated to move the chuck table 54 in a direction indicated by arrow X1 in FIGS. 4A and 4B on a relative basis, whereby the laser beam is applied along the division line 12. By this, the shield tunnels 100 each composed of a minute hole 102 extending vertically from the front surface 10a to the back surface 10b of the wafer 10 and an amorphous phase 104 shielding the minute hole 102 are formed in succession along the division line 12 (see FIG. 4B).

The laser beam applying means 44, the chuck table 54, the X-direction moving means 60, and the Y-direction moving means 65 are operated according to the control program in the controller 20, whereby the shield tunnels 100 which are the same as above are formed along all the division lines 12 formed on the wafer 10. After the step of forming the shield tunnels 100 is completed in this way, the wafer 10 is fed to a separating step of separating the wafer 10 into individual devices 14 by exerting an external force thereon. Note that the separating step does not constitute an essential part of the present invention and can be carried out using known separating means (see, for example, FIG. 8 and the description in Japanese Patent Laid-open No. 2014-221483 mentioned above), and, therefore, detailed description of the separating step is omitted.

Note that laser processing conditions in the processing for forming the shield tunnels are set, for example, as follows. Note that "wavelength of pulsed laser beam" in the following is the wavelength of a pulsed laser beam wherein a burst pulse composed of a plurality of sub-pulses is one pulse.

Wavelength of pulsed laser beam: 1,030 nm
Oscillation frequency of seeder: 10 MHz
Number of sub-pulses constituting burst pulse: 5
Repetition frequency of pulsed laser beam: 50 kHz
Average output after amplification: 3 W
Spot diameter: 10 µm
(Numerical aperture of focusing lens)/(Refractive index of wafer): 0.05 to 0.20
X-direction processing feed speed: 500 mm/second
Shield tunnel size: φ1 µm minute hole, φ10 µm amorphous phase The present invention is configured as above, so that one shield tunnel is formed by one burst pulse which is composed of a plurality of sub-pulses. Therefore, the damage given to the devices formed using an epitaxial layer by the action of leakage light or the like can be restrained, as compared to the case where one shield tunnel is formed by giving a high energy by one-time pulse. Particularly, in the above-described embodiment, the plurality of sub-pulses constituting one burst pulse are generated in such a manner that the energy of the sub-pulse changes from a lower energy to a higher energy, and the pulsed laser beam including the burst pulses is applied to the wafer, whereby damaging of the epitaxial layer can be securely obviated.

Note that the present invention is not limited to the above-described embodiment but can include various modifications. While an example in which lithium tantalate is adopted as the substrate of the wafer to be processed has been shown in the above embodiment, this is not restrictive, and any material that permits formation of the shield tunnels therein, such as lithium niobate and silicon carbide (SiC), can be adopted. In addition, the acousto-optic modulator (AOM) has been used in extracting a plurality of pulses from high-frequency pulses oscillated by the seeder so as to generate the burst pulses each composed of a plurality of sub-pulses, this is not restrictive; for example, an electro-optic modulator (EOM), a laser shutter, or the like known method can be adopted as means for thinning out pulses at a predetermined repetition frequency from high-frequency pulses oscillated from the seeder.

The present invention is not limited to the details of the above described preferred embodiment. The scope of the invention is defined by the appended claims and all changes and modifications as fall within the equivalence of the scope of the claims are therefore to be embraced by the invention.

What is claimed is:
1. A laser processing apparatus comprising:
a chuck table that holds a wafer;
laser beam applying means that applies a laser beam to the wafer held by the chuck table; and
moving means for moving the chuck table relative to the laser beam applying means,
wherein the laser beam applying means includes a laser oscillator that oscillates a pulsed laser beam, and a focusing device that focuses the pulsed laser beam oscillated by the laser oscillator to apply the pulsed laser beam to the wafer held by the chuck table, and
the pulsed laser beam oscillated by the laser oscillator includes burst pulses each having a plurality of sub-pulses, wherein each of the sub-pulses comprises a single pulse, and the burst pulses are applied to the wafer to form shield tunnels each including a minute hole and an amorphous phase surrounding the minute hole,
a controller configured and arranged to control the laser beam applying means such that the laser oscillator generates the plurality of sub-pulses constituting each burst pulse in such a manner that energy of each of the sub-pulses sequentially increases from a lower energy to a higher energy within each of said burst pulses.

* * * * *